United States Patent [19]

Bert et al.

[11] 4,430,623
[45] Feb. 7, 1984

[54] MONOLITHIC AMPLIFIER COMPRISING A POWER DIVISION AND RECOMBINATION SYSTEM GROUPING A PLURALITY OF TRANSISTORS

[75] Inventors: Alain Bert; Didier Kaminsky, both of Paris, France

[73] Assignee: Thomson-CSF, Paris, France

[21] Appl. No.: 297,965

[22] Filed: Aug. 31, 1981

[30] Foreign Application Priority Data

Sep. 2, 1980 [FR] France ................................ 80 18926

[51] Int. Cl.³ .............................................. H03F 3/60
[52] U.S. Cl. ...................................... 330/286; 330/54
[58] Field of Search .................................... 330/53–57, 330/286

[56] References Cited
U.S. PATENT DOCUMENTS 3,593,174  7/1971  White ................................. 330/286

Primary Examiner—James B. Mullins
Assistant Examiner—Gene Wan
Attorney, Agent, or Firm—Oblon, Fisher, Spivak, McClelland & Maier

[57] ABSTRACT

A device combining a certain number of elementary amplifiers formed on the same semiconductor wafer having a very high frequency (about 10 GHz), thus obtaining a monolithic amplifier with a high power and a wide pass band. This amplifier comprises at the input a first transmission line of the microstrip type, bent in such a way that it has an input branch and a tap branch where the waves reflected as a result of mismatches are absorbed in a resistive load. The bent region of line is connected to a row of elements of the impedance transformation lines passing to the gates (case of field effect transistors). It comprises at the output a second microstrip line parallel to the first and bias connected to a row of elements identical to those of the amplifier input.

10 Claims, 5 Drawing Figures

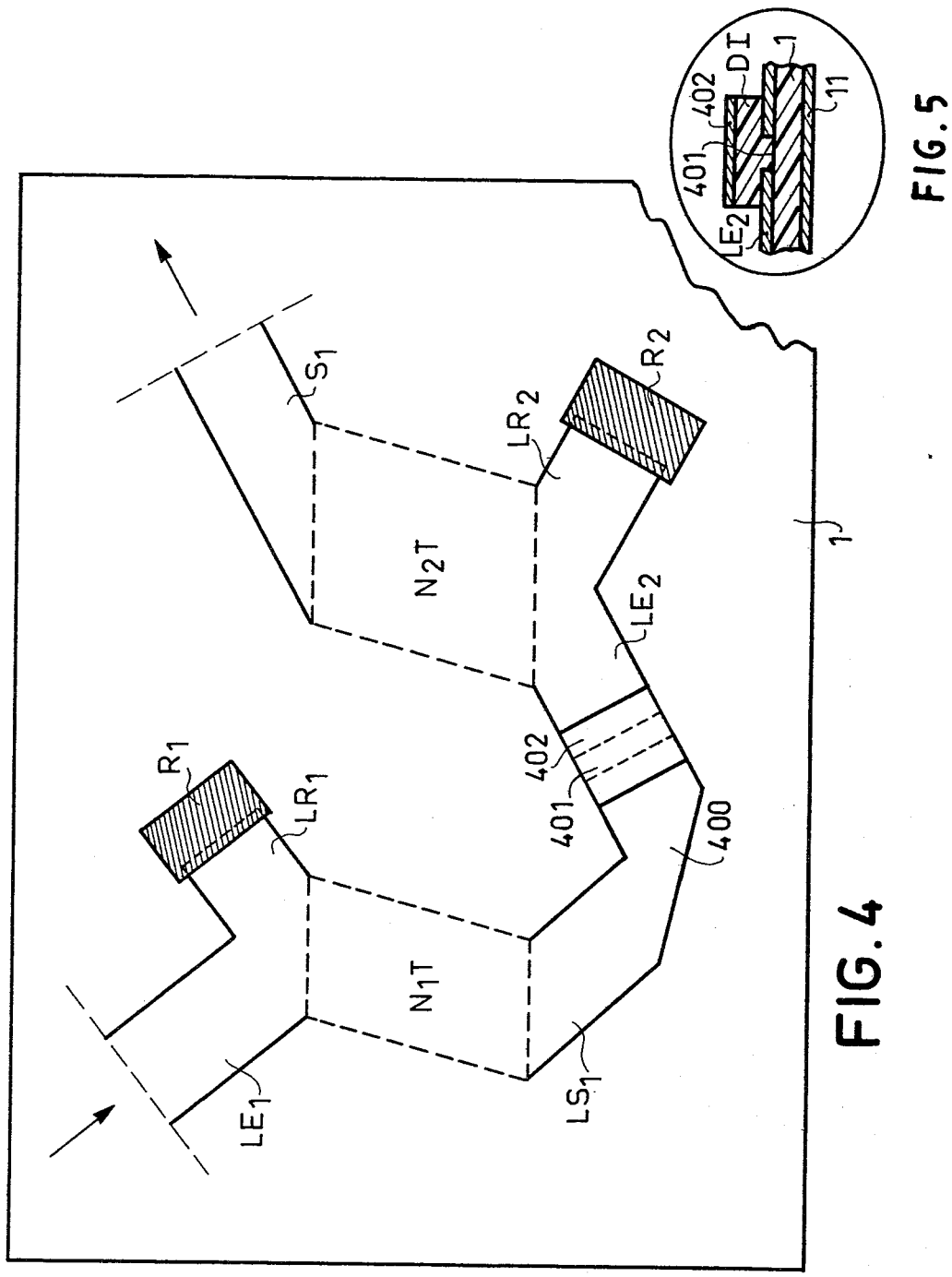

MONOLITHIC AMPLIFIER COMPRISING A POWER DIVISION AND RECOMBINATION SYSTEM GROUPING A PLURALITY OF TRANSISTORS

BACKGROUND OF THE INVENTION

The invention relates to a new way of combining a certain number of elementary amplifiers, constituted more particularly by field effect transistors formed on the same semiconductor wafer with a view to obtaining a monolithic amplifier having a high power on a wide pass band, all the means used being integrated on the same semiconductor wafer.

The power of a field effect transistor is directly proportional to the width of the gate all other things being equal. The only widely used solution at present for obtaining a significant power without introducing losses which may reduce the gain, consists of the connection in parallel of a certain number of identical transistors, whose width is typically 100 to 200 μm. The obtainable power levels are approximately 0.5 W/mm of gate (1 W/mm in the laboratory) in the X band. Thus, the number of elements to be connected in parallel is approximately 10 to 20 per watt. The longitudinal size of each transistor is dependent on the way in which the source is connected to earth and is typically 50 to 150 μm for transistors in the X and Ku band. Thus, on average a longitudinal size of approximately 0.5 to 1 mm/W is obtained by connecting in parallel.

However, all the metallic connections produced for performing the connection between these elements (gates and drains) form, with the metal base to which the amplifier is welded, a propagation line whose wavelength is approximately 10 mm to 10 GHz (on gallium arsenide). Thus, as from a power of a few watts the dimensions of the connections become approximately a quarter of the wavelength. As from then the uniformity of the power distribution between the different elements becomes impossible and the performance levels can no longer be proportional to the number of elements. For this reason amplifiers are produced in the form of "modules", whose power generally does not exceed 1 watt in the X band.

Several modules must be connected in parallel to obtain amplifiers of a few watts. It is known to carry out this connection in parallel by using dividers-recombiners produced on supports different from those of the modules. Quite apart from the technological difficulties this method does not give good results if the modules are not strictly identical and are not placed on paths of strictly identical length.

A partial solution to these problems is provided by using a WILKINSON phase splitter comprising ballast resistors. A star arrangement involving a distribution over a cylinder of transistors and their matching elements makes it possible to obtain a high power level, but has the disadvantages of an amplification band of a very limited width and a very complex construction.

The use of so-called LANGE couplers makes it possible to obtain a pyramidal cascade of couplers (in pairs) as a result of which a wide frequency band is obtained. However, the combination of a large number of elementary amplifiers leads to considerable complexity.

The patent application filed by the Assignee Company in the United States under Ser. No. 218,101 on Dec. 19, 1980, in Japan under No. 00 3697/81 on Jan. 13, 1981 and in France on Jan. 15, 1980 under NO. 80 00 845 describes a high frequency power distributor using a travelling wave divider. In an amplifier equipped with such a system the power is progressively distributed over the different amplifier modules as a function of the propagation along an input divider. Putting back into phase is brought about by using a structure of the same type for the recombination of the powers at the output. Resistors deposited on the semiconductor plates of the modules ensure both the balancing between the channels and the absorption of the reflected waves due to the mismatches of the modules.

BRIEF SUMMARY OF THE INVENTION

The invention makes it possible to become independent of ballast resistors, which is a simplification in the case of monolithic amplifiers with a very large number of transistors, by only using a single absorption charge of the reflected waves, whilst producing the complete amplifier on a single semiconductor wafer.

Therefore the present invention relates to a monolithic amplifier comprising on the same semiconductor wafer a first bent transmission line having an input branch and a tap branch leading to a resistive load etched on the wafer and also comprising on the same wafer a plurality of impedance transformation line elements connected in parallel to the bent part of the transmission line on the one hand and on the other hand to the inputs of parallel-connected transistor amplifiers, a second plurality of impedance transformation lines being connected to the output of the transistor amplifiers and leading to a second transmission line.

BRIEF DESCRIPTION OF THE DRAWINGS

The invention is described in greater detail hereinafter relative to non-limitative embodiments and the attached drawings, wherein:

FIG. 4 shows a third variant; and

FIG. 5 illustrates the capacitive decoupling of the lines of FIG. 4.

DETAILED DESCRIPTION OF THE PREFERRED EMBODIMENTS

Figure 1:
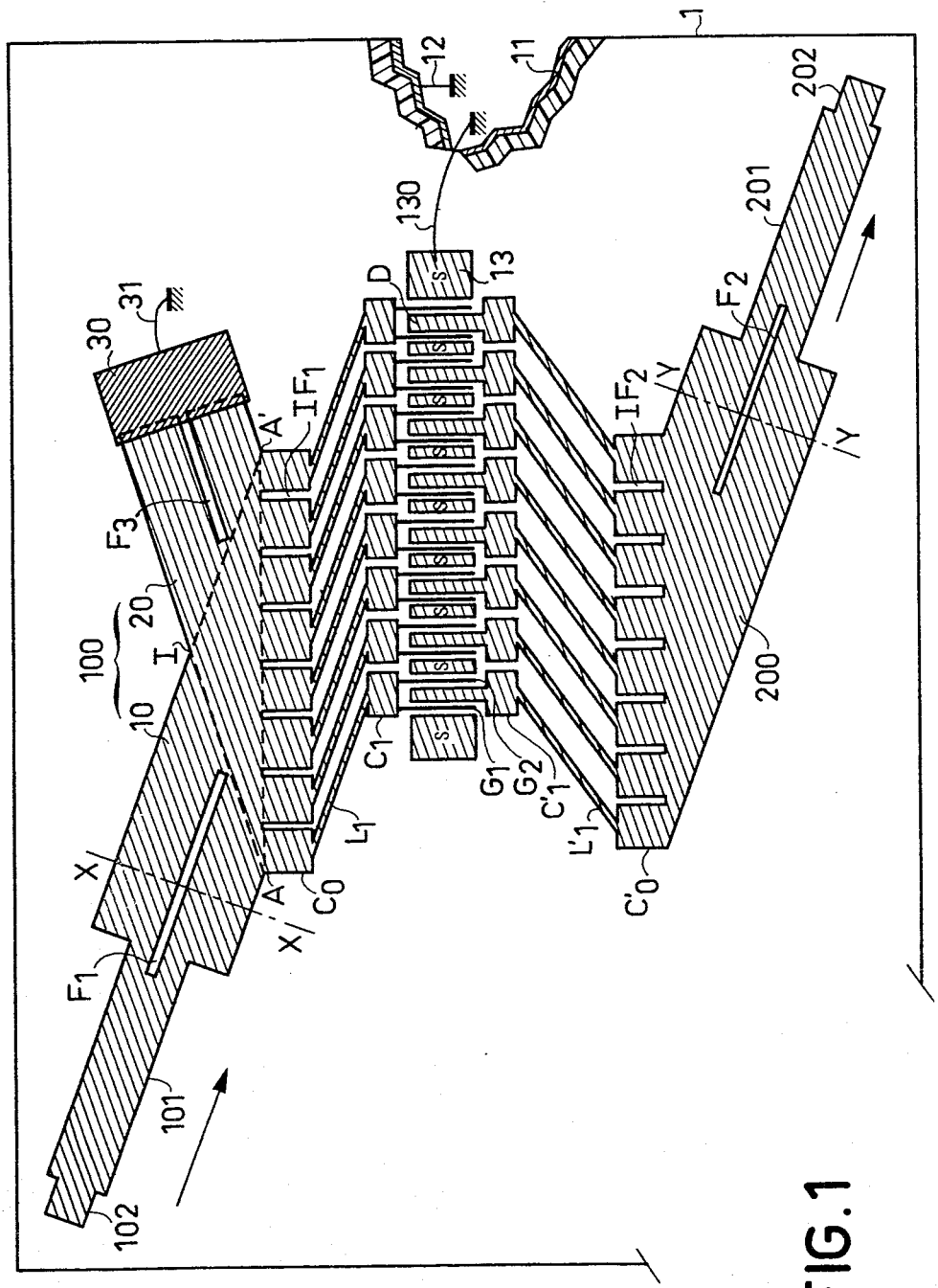
FIG. 1 shows diagrammatically an embodiment of the invention.

FIG. 1 shows a semiconductor wafer 1 constituted by a gallium arsenide monocrystalline substrate doped so as to be semi-insulating and covered in its lower part by a metal coating 11 serving as an earth plane, as well as for receiving in the opposite part contacts of transistors and metal coatings of transmission lines of the microstrip type.

The drawing of FIG. 1 shows a notch in the wafer, revealing the thickness of the substrate 1 and its earth plane 11 connected diagrammatically to earth by a symbolic connection 12.

The number of transistors shown has been limited to eight and the number of their gates to two (the electrode of each gate being symbolized by a line having a certain thickness). The sources and drains of these field effect transistors are ohmic contacts produced in conventional manner by successive metallic coatings. The gates are metallic coatings produced in conventional manner to give a Schottky contact.

Specific reference is made to the following features:

(a) The sources marked S in FIG. 1 are connected to the earth plane either by a plated-through hole in the gallium arsenide (i.e. not visible in the drawing) or by a gold wire 130, as has been shown for electrode 13. There are nine source contacts for eight transistors, because in conventional manner each pair of gates $G_1$ and $G_2$ is flanked by two contacts S, whilst a drain contact D is located between the actual gates.

(b) Each pair of gates constituting the input of an elementary amplifier is connected to metal coatings forming the same number of impedance transformation lines. Each line has two rectangular metallic deposits $C_1$ and $C_0$ connected by a narrow metal strip $L_1$. The equivalent diagram in high frequency of such a line is a low pass filter incorporating an inductive part $L_1$ and two capacitors $C_0$ and $C_1$ of values calculated as a function of the impedance transformation ratio to be obtained, bearing in mind that the actual capacitance of each deposit is modified by the capacitances of the elements to which it is connected, namely those of the grids of the field effect transistors for $C_1$ and the capacitance, at the connection point, of a microstrip-type transmission line 100 with two branches 10 and 20 interconnected in the form of a triangle $AIA'$.

(c) Each drain is connected to one of the metal coatings constituted by identical transmission lines arranged on the output side of each elementary amplifier. Thus, there is a narrow metal strip $L'_1$ connecting two deposits $C'_1$ and $C_0$. The low pass filter differs from that on the gate side due to the impedance difference.

The following points are made regarding the actual impedance transformation lines:

(1) The metal deposits $C_0$ and $C'_0$ are connected to lines 100 and 200 respectively, leaving slots $IF_1$ and $IF_2$ between these deposits.

(2) The slope of strips $L_1$ and $L'_1$ relative to the row of transistors is optional and only serves to reduce the surface occupied by the amplifier on the wafer made from gallium arsenide, which is an onerous material. An overall dimensional reduction is also sought.

The slope of lines 100 and 200, which are parallel to one another, is guided by the following considerations:

(a) It is desired to facilitate the division of the impedance characterizing each line by distributing it between the deposits $C_0$ and $C'_0$ located respectively at the input of each impedance transformation line.

(b) It is desired to facilitate the bias connection, by side $IA'$ of triangle $IAI'$, of branch 20 of line 100.

(c) The parallelism of line 200 with line 100 makes it possible to correct phase displacements caused by the bias connection of line 100 to the row of transistors.

Finally branch 20 of line 100 leads to a resistive load 30 constituted, for example, by a nickel-chromium alloy deposit. This load 30 is connected to earth, as symbolized by a connection 31, but generally realized by a connection across the thickness of wafer 1.

FIG. 1 also shows other characteristics of lines 100 and 200. Firstly these lines comprise sections of decreasing width 101, 102 and 201, 202. The least wide section corresponds, for example, to the normal impedance of high frequency equipment, i.e. 50 ohms. The widest sections have lower impedances of which account is taken when designing the impedance transformation lines at both the input and the output of each transistor. In addition, slots $F_1$ for line 10, $F_3$ for line 20 and $F_2$ for line 200 are made in the longitudinal axis of each line. These slots are optionally filled with a resistive deposit. They aim at eliminating any propagation mode of the travelling wave in the transverse direction, i.e. that of axes XX and YY perpendicular to the direction of the longitudinal axis of the line.

The operation of the aforementioned amplifier can be summarized as follows. On initially disregarding branch 20 and assuming branch 10 to be defined by line $IA'$, it is found as a first approximation the parallel connection of eight lines of characteristic impedance eight times higher than branch 10 (in its widest part). Thus, on assuming that the latter is 12.5 ohms, each of the eight imaginary lines corresponds to an impedance of 100 ohms. Accordingly on also assuming that the impedance transformation lines in each case provide an impedance of 100 ohms the widest line of branch 10 is perfectly adapted. This is only proved for the highest frequencies of the band in which the amplifier is to operate.

It should also be noted that the various transistors are not in phase. However, the arrangement of the amplifier is such that this delay is compensated at the output, in the manner indicated hereinbefore. Thus, this arrangement makes it possible to act on a row of transistors such that the length $AA'$ optionally exceeds quarter the wavelength (measured in the substrate) on starting with a smaller width transmission line, whose value is chosen as a function of the impedance provided by the impedance transformation lines ($C_0$, $L_1$, $C_1$).

If consideration is now given to the lowest frequencies of a relatively wide frequency band, the elementary amplifiers constituted by the various transistors no longer have the desired impedance of 100 ohms in the selected example. A generally capacitive reactive part appears. Consequently reflected waves appear with different phases of each elementary amplifier input. However, all the branches 10 and 20 can be roughly likened to a bent line, whose bend has been truncated. It is known that in this case it is possible to conveniently choose the distance between point I and line $AA'$ in such a way that all the incident energy in branch 10 is found in branch 20. This is due to the phase relationships leading to the reflected elementary waves being in phase in branch 20, which is not the case in branch 10. This causes no problem for lengths of $AA'$ of about a quarter the wavelength, because the reflected waves in branch 10 are then in phase opposition at the two ends of said line.

All that has been stated hereinbefore assumes that there is no propagation according to the anti-symmetrical mode, which is mitigated by the aforementioned slots $F_1$ and $F_3$. Thus, under these conditions the reflections are either absorbed in resistor 30 or in slot $F_3$, when the latter is resistive. It is therefore possible to balance the amplification gain in a wide pass band in spite of the selective reflections at the input of the elementary amplifiers.

Figure 2:
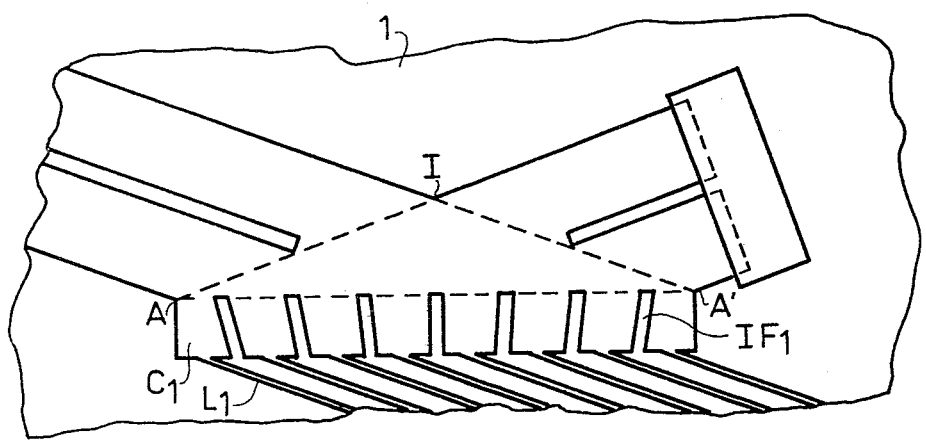
FIG. 2 shows diagrammatically a first variant.
Figure 3:
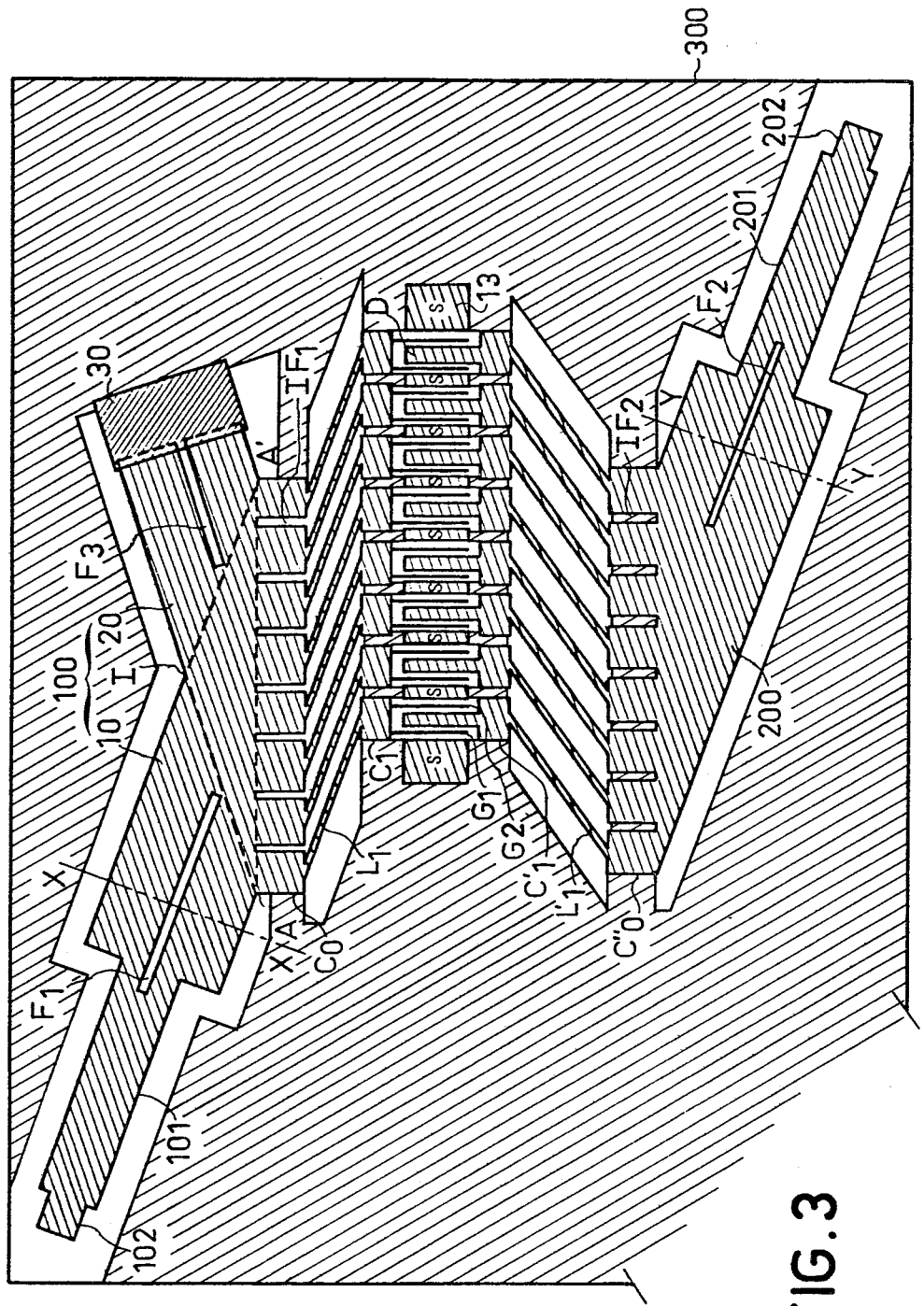
FIG. 3 shows a second variant.

Variants of the amplifier of FIG. 1 are shown in FIGS. 2 and 3.

FIG. 2 only shows that part of the amplifier surrounding triangle $AIA'$. In this variant slot $IF_1$ of each end of the row of seven slots is outwardly inclined in order to reduce the access to deposit $C_1$ of the current coming from branch 10. The median slot remains as it is, whilst the intermediate slots are progressively inclined. The sought result is the balancing of the currents at the input of the lines leading to the different transistors. Due to the unequal distribution of the very high frequency current, according to which the current density is much greater at the edges of the transmission line, the accesses for the deposit $C_0$ located in increasingly eccentric positions must be progressively reduced to compensate the current density increase at the ends.

FIG. 3 shows an amplifier which is identical to that of FIG. 1 except that wafer 1 no longer necessarily has a lower metal coating, a metal coating 300 being made before depositing the metal coatings of the impedance transformation lines on the periphery of the wafer, but sufficiently close to the transmission lines to form an earth plane like that of a coplanar line.

The ohmic contacts S are also interconnected and are connected to earth due to the fact that metal coating 300 is deposited at the very location of deposit $C_1$, $C'_1$ and $C_0$, $C'_0$. Although, for reasons of clarity, contacts S are shown in FIG. 3, on examination they cannot be distinguished from the finished product.

The corresponding capacitances of the impedance transformation lines are produced by depositing an oxide coating (e.g. of $SiO_2$) at the corresponding locations, then depositing a supplementary metal coating which acts as the second coating, the first being formed by metal coating 300.

FIG. 4 shows in a highly simplified manner a two-stage monolithic amplifier comprising two amplifiers, as in FIG. 1, produced on the same gallium arsenide wafer 1. They comprise respectively a row $N_1T$ of $n_1$ transistors and a row $N_2T$ of $n_2$ transistors. The output line $LS_1$ of the first amplifier is connected to the input transmission line $LE_2$ of the second amplifier. Capacitive decoupling is provided so that it is possible to separately polarize the drains of the first amplifier and the gates of the second amplifier. In order to reduce the surface of the wafer the two amplifiers are arranged in a substantially "head-to-tail" manner, involving the connection of the lines $LS_1$ and $LS_2$ by a bent part 400. The design of this bent part is determined in the same way as that of the bent part of line $LE_1$.

The first amplifier comprises an input line $LE_1$ corresponding to branch 10 of line 100 (FIG. 1) and a tap line $LR_1$ terminated by a resistive load $R_1$, said line and said load being respectively identical to branch 20 and load 30 of the amplifier of FIG. 1.

The capacitive decoupling of lines $LS_1$ and $LS_2$ is carried out, for example, by interrupting line $LE_2$ at a point 401 by depositing an insulating oxide coating DI, e.g. of $SiO_2$ over gap 401 and by covering the oxide coating with a metallic deposit 402 as shown in FIG. 5.

The second amplifier also comprises a tap line $LR_2$ terminated by a resistor $R_2$, identical to the resistive load $R_1$. Finally an output line $LS_2$ located at the output of the second amplifier constitutes the output of the two-stage amplifier.

Among the advantages of the invention which have not as yet been referred to, reference can be made to the possibility of obtaining on a 20 to 40 mm² gallium arsenide wafer a power of between 1 and a few watts at a frequency of 10 GHz with a frequency band exceeding 50% and an amplification gain of several decibels.

The invention is applicable to an amplifier comprising bipolar transistors by respectively replacing the source, gate and drain of the field effect transistor by the emitter, base and collector of the bipolar transistor.

What is claimed is:

1. A monolithic amplifier of the type having a power division and recombination system grouping a plurality of transistors, said amplifier comprising on a single semi-conductor wafer;

a first bent transmission line having an input branch and a tap branch wherein said tap branch forms a reflection and absorption line leading to a resistive load etched on said wafer;

a plurality of distribution lines said distribution lines having impedance transformation line elements connected at one end in parallel to the bent part of said bent transmission line and on the other end to the inputs of a plurality of parallel-connected transistor amplifiers wherein said impedance transformation line elements are separated from each other by a plurality of variable tilting slots in order to distribute energy; and a second plurality of impedance transformation lines being connected to the output of said transistor amplifiers and to the input of an output transmission line wherein said input branch, said tap branch and said output transmission line each have a transversal reflections slot made in the longitudinal axis of each of the said tap branch, said input branch and said output transmission line to provide for elimination of traveling waves in the transverse direction, and wherein the angle between said tap branch and said input branch of said bent transmission line is chosen so that reflected waves are in phase in said tap branch.

2. An amplifier according to claim 1, wherein the transmission lines are of the microstrip type, the conductor of each line being etched on a first large face of the semiconductor wafer and the ground plane being obtained by a metal coating of the second large face of the wafer opposite to the first large face.

3. An amplifier according to claim 1, wherein the transmission lines are of the coplanar type, the central conductor of each line being surrounded by metal coatings which are interconnected to constitute a single ground plane etched on the same large face of the wafer as the central conductor.

4. An amplifier according to claim 2, wherein each impedance transformation line element comprises a microstrip line section between two metal deposits forming with the earth plane input and output capacitances of the line element.

5. An amplifier according to claim 3, wherein each impedance transformation line element comprises a microstrip line section between two metal deposits forming capacitors with said ground plane due to the prior deposition of an insulant between the earth plane and each of the two deposits.

6. An amplifier according to claim 1, wherein it comprises field effect transistors, whose sources are connected to said ground plane, whose gates are connected to the first transmission line and whose drains are connected to the second transmission line.

7. An amplifier according to claim 1, wherein it comprises bipolar transistors, whose emitters are connected to said ground plane, whose bases are connected to the first transmission line and whose collectors are connected to the second transmission line.

8. An amplifier according to claim 3, wherein as the transmission lines are of the coplanar type and the transistors are of the field effect type, the sources are connected to the metal coating of said ground plane, which passes beneath part of the impedance transformation lines due to the interposing of an insulating deposit between the earth plane and the latter.

9. An amplification device comprising at least a first and a second amplifier, each said amplifier formed according to said monolithic amplifier of claim 1, wherein the two amplifiers are formed on the same wafer and are separately polarized.

10. An amplification device according to claim 9, wherein the second transmission line of the first amplifier and the first transmission line of the second amplifier are connected by a bent portion and have capacitive decoupling.

* * * * *